(12) United States Patent
Moon et al.

(10) Patent No.: US 11,495,284 B2
(45) Date of Patent: Nov. 8, 2022

(54) MEMORY DEVICE INCLUDING BITLINE SENSE AMPLIFIER AND OPERATING METHOD THEREOF

(71) Applicant: Samsung Electronics Co., Ltd., Suwon-si (KR)

(72) Inventors: Jong-Ho Moon, Seoul (KR); Sung-Hwan Jang, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/202,466

(22) Filed: Mar. 16, 2021

(65) Prior Publication Data
US 2022/0020423 A1 Jan. 20, 2022

(30) Foreign Application Priority Data

Jul. 17, 2020 (KR) .................. 10-2020-0088720
Mar. 3, 2021 (KR) .................. 10-2021-0028193

(51) Int. Cl.
| | | |
|---|---|---|
| *G11C 7/12* | (2006.01) | |
| *G11C 11/4091* | (2006.01) | |
| *G11C 11/4074* | (2006.01) | |
| *G11C 11/4096* | (2006.01) | |
| *G11C 11/4094* | (2006.01) | |
| *G11C 11/4076* | (2006.01) | |

(52) U.S. Cl.
CPC ...... *G11C 11/4091* (2013.01); *G11C 11/4074* (2013.01); *G11C 11/4076* (2013.01); *G11C 11/4094* (2013.01); *G11C 11/4096* (2013.01)

(58) Field of Classification Search
CPC .......... G11C 11/4091; G11C 11/4074; G11C 11/4076; G11C 11/4094; G11C 11/4096
See application file for complete search history.

(56) References Cited

U.S. PATENT DOCUMENTS

| | | |
|---|---|---|
| 5,677,886 A | 10/1997 | Seo et al. |
| 5,701,268 A | 12/1997 | Lee et al. |
| 7,929,367 B2 | 4/2011 | Yoo et al. |
| 8,537,631 B2 | 9/2013 | Chung |

(Continued)

FOREIGN PATENT DOCUMENTS

| | | |
|---|---|---|
| JP | 4882322 B2 | 2/2012 |
| JP | 2016058111 A | 4/2016 |
| KR | 1019980037922 A | 8/1998 |

*Primary Examiner* — Mushfique Siddique
(74) *Attorney, Agent, or Firm* — Muir Patent Law, PLLC

(57) ABSTRACT

Disclosed are a memory device and an operating method thereof. The memory device includes a bitline sense amplifier connected to a bitline and a complementary bitline connected to a memory cell, and a sense amplifier driver circuit. The bitline sense amplifier senses and amplifies a voltage difference by developing a voltage of the bitline and a voltage of the complementary bitline. The sense amplifier driver circuit includes a pull-up circuit adjusting a level of a bitline low-level voltage developed by the bitline sense amplifier to be higher than a ground voltage in response to a first pull-up pulse, and a pull-down circuit adjusting the level of the bitline low level adjusted by the pull-up circuit to be equal to the ground voltage in response to a pull-down pulse. A pulse generator generates the first pull-up pulse and the pull-down pulse based on a command received from a host.

18 Claims, 9 Drawing Sheets

(56) References Cited

U.S. PATENT DOCUMENTS

| | | | |
|---|---|---|---|
| 8,681,084 B2 | 3/2014 | Haga et al. | |
| 9,147,465 B2 | 9/2015 | Seo et al. | |
| 9,520,177 B2 | 12/2016 | Matsumoto et al. | |
| 2003/0147271 A1* | 8/2003 | Jo | G11C 11/4091 365/149 |
| 2006/0023535 A1* | 2/2006 | Chun | G11C 11/4094 365/205 |
| 2009/0296453 A1* | 12/2009 | Lee | G11C 11/406 365/189.09 |
| 2010/0054016 A1* | 3/2010 | Kajigaya | G11C 7/067 365/205 |
| 2013/0176803 A1 | 7/2013 | Lee et al. | |
| 2018/0122442 A1* | 5/2018 | Son | G11C 7/065 |

\* cited by examiner

MEMORY DEVICE INCLUDING BITLINE SENSE AMPLIFIER AND OPERATING METHOD THEREOF

CROSS-REFERENCE TO RELATED APPLICATIONS

This application claims priority under 35 U.S.C. § 119 to Korean Patent Application No. 10-2020-0088720 filed on Jul. 17, 2020 and Korean Patent Application No. 10-2021-0028193 filed on Mar. 3, 2021, in the Korean Intellectual Property Office, the disclosure of each of which is incorporated by reference herein in their entirety.

BACKGROUND

Embodiments of the inventive concept described herein relate to a memory device and an operating method thereof, and more particularly, relate to a memory device including a bitline sense amplifier and an operating method thereof.

A memory cell array included in a memory device implemented as a dynamic random access memory (DRAM) may be connected to a bitline sense amplifier through a bitline and a complementary bitline. The bitline sense amplifier may sense a voltage difference between the bitline and the complementary bitline and may amplify the sensed voltage difference. Data stored in the memory cell array may be read based on the sense and amplification operation of the bitline sense amplifier.

When the bitline sense amplifier senses a voltage difference between the bitline and the complementary bitline, a noise may occur at memory cells not targeted for sensing. This noise may cause an error in data stored in the memory cells not targeted for sensing. As such, the reliability of the DRAM may be reduced.

SUMMARY

Embodiments of the inventive concept provide a memory device including a bitline sense amplifier and an operating method thereof.

According to an exemplary embodiment, a memory device may include a bitline sense amplifier that is connected to a bitline and a complementary bitline connected to a memory cell and senses and amplifies a difference between a voltage of the bitline and a voltage of the complementary bitline, and a sense amplifier driver circuit. The sense amplifier driver circuit may adjust a level of a bitline low-level voltage of the bitline sense amplifier in response to a command received from a host, so as to be higher than a level of a ground voltage.

According to an exemplary embodiment, a memory device may include a bitline sense amplifier that is connected to a bitline and a complementary bitline connected to a memory cell and senses and amplifies data stored in the memory cell, and a sense amplifier driver circuit. The sense amplifier driver circuit may generate a first pull-up pulse and a pull-down pulse based on a command received from a host and may adjust a level of a bitline low voltage to be developed by the bitline sense amplifier in response to the first pull-up pulse and the pull-down pulse. The level of the bitline low voltage may be higher than a ground voltage as much as a delta voltage when a read operation is performed on the memory cell and may be equal to the ground voltage when a write operation is performed on the memory cell.

According to an exemplary embodiment, an operating method of a memory device which includes a bitline sense amplifier connected to a bitline and a complementary bitline. The bitline and the complementary bitline are connected to a plurality of memory cells. The method may include sensing and amplifying data stored in a target memory cell of the plurality of memory cells, applying a voltage of a first node of the bitline sense amplifier to one of the bitline and the complementary bitline, restoring the data stored in the target memory cell and then increasing a voltage level of the first node of the bitline sense amplifier from a ground voltage, or writing a first data in the target memory cell and then increasing the voltage level of the first node of the bitline sense amplifier from the ground voltage, and decreasing the voltage level of the first node of the bitline sense amplifier to the ground voltage. Each of the plurality of memory cells may include a transistor of a floating body structure.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Hereinafter, some example embodiments of the inventive concept will be described in detail with reference to accompanying drawings. With regard to the description of the inventive concept, to make the overall understanding easy, similar components will be marked by similar reference signs/numerals in drawings, and thus, additional description will be omitted to avoid redundancy.

Figure 1:
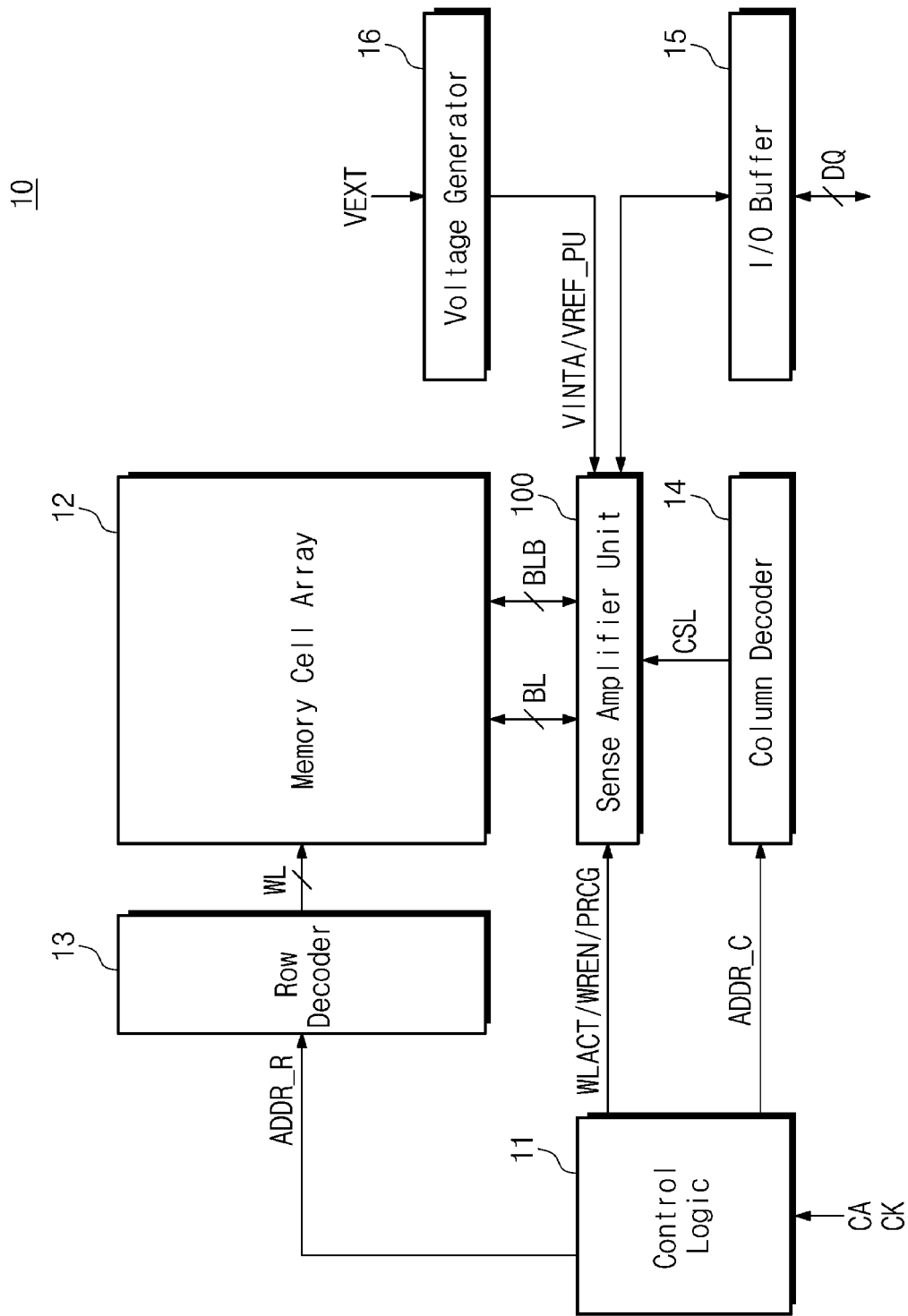
FIG. 1 illustrates a block diagram of a memory device according to an embodiment of the inventive concept.

FIG. 1 illustrates a block diagram of a memory device according to an embodiment of the inventive concept. Referring to FIG. 1, a memory device 10 may include a control logic 11, a memory cell array 12, a row decoder 13, a column decoder 14, an input/output buffer 15, a voltage generator 16, and a sense amplifier unit 100. In an embodiment, the memory device 10 may be implemented as a dynamic random access memory (DRAM).

The control logic 11 may receive a command/address CA and a clock CK from an external device (referred to as a "host", a "central processing unit (CPU)", a "memory controller", or the like). The command/address CA may include a command indicating an operation to be performed by the memory device 10, a row address ADDR_R indicating a row of a memory cell targeted (hereinafter referred to as a "target memory cell") for the operation to be performed by the memory device 10, and a column address ADDR_C indicating a column of the target memory cell. The control logic 11 may transmit the row address ADDR_R to the row decoder 13 and may transmit the column address ADDR_C to the column decoder 14.

The control logic 11 may decode the received command/address CA. For example, the control logic 11 may include a decoder that decodes the received command/address CA. The control logic 11 may receive an active command, a read/write command, a precharge command, or the like from the host and may decode the received command. The control logic 11 may generate a wordline active signal WLACT, a write enable signal WREN, or a precharge signal PRCG based on the decoding result and may transmit the generated signal to the sense amplifier unit 100. For example, the wordline active signal WLACT may be generated in response to the active command, the write enable signal WREN may be generated in response to the write command, and the precharge signal PRCG may be generated in response to the precharge command.

Figure 2:
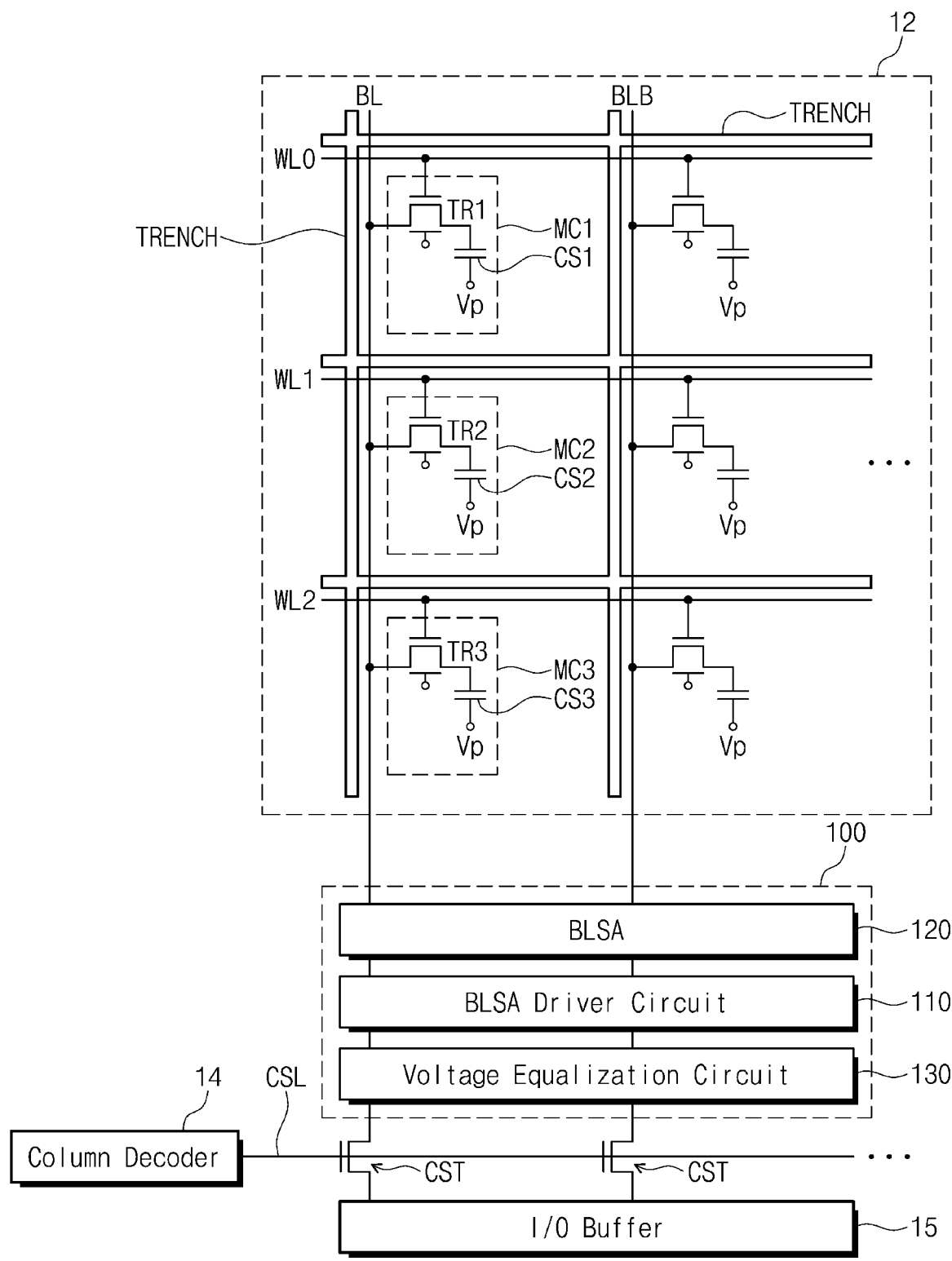
FIG. 2 is a diagram illustrating a portion of a memory device of FIG. 1 in detail according to example embodiments.

The memory cell array 12 may include a plurality of memory cells (e.g., MC1, MC2, and MC3 of FIG. 2). For example, the memory cells included in the memory cell array 12 may be arranged at points where a plurality of wordlines WL and a plurality of bitlines BL intersect. Each of the memory cells may be connected to the corresponding wordline among the plurality of wordlines WL. Each of the memory cells may be connected to the corresponding bitline of the plurality of bitlines BL and the corresponding complementary bitline of a plurality of complementary bitlines BLB. The memory cells may be provided in the form of a matrix. In this case, the plurality of wordlines WL may be connected to rows of the memory cells, and the plurality of bitlines BL and the plurality of complementary bitlines BLB may be connected to columns of the memory cells. The memory cell array 12 will be more fully described with reference to FIG. 2.

The row decoder 13 may receive the row address ADDR_R from the control logic 11. The row decoder 13 may be connected to the memory cell array 12 through the plurality of wordlines WL. By decoding the received row address ADDR_R, the row decoder 13 may select one wordline of the plurality of wordlines WL connected to the memory cell array 12. The row decoder 13 may activate the selected wordline by applying a voltage to the selected wordline.

The column decoder 14 may receive the column address ADDR_C from the control logic 11. The column decoder 14 may be connected to the sense amplifier unit 100 through a column select line CSL. By decoding the received column address ADDR_C, the column decoder 14 may select a bitline(s) and a complementary bitline(s) corresponding to a read unit from among the plurality of bitlines BL connected to the memory cell array 12. The column decoder 14 may select a bitline and a complementary bitline by applying a voltage to the column select line CSL.

When the memory device 10 performs a write operation in response to the command/address CA, the input/output buffer 15 may receive data DQ from the external device. The input/output buffer 15 may temporarily store the received data DQ. The input/output buffer 15 may transmit the stored data DQ to the sense amplifier unit 100.

When the memory device 10 performs a read operation in response to the command/address CA, the input/output buffer 15 may receive data from the memory cell array 12 after sensing by the sense amplifier unit 100 and may temporarily store the received data. As data stored in the memory cell array 12, the data temporarily stored in the input/output buffer 15 may be output to the external device in response to a request of the external device.

The voltage generator 16 may generate various voltages capable of being used in the memory device 10. For example, the voltage generator 16 may receive an external voltage VEXT from the outside of the memory device 10, that is, the external device. The voltage generator 16 may generate an internal voltage VINTA and a pull-up reference voltage VREF_PU, based on the external voltage VEXT. For example, the internal voltage VINTA may be applied to the memory cell array 12.

The sense amplifier unit 100 may sense data stored in the memory cell array 12, may amplify a voltage corresponding to the sensed data, and may output data corresponding to the amplified voltage to the external device in response to a request of the external device. For example, the sense amplifier unit 100 may sense data stored in a target memory cell, based on the signals WLACT, WREN, and PRCG received from the control logic 11 and the voltages VINTA and VREF_PU received from the voltage generator 16. An operation of the sense amplifier unit 100 will be more fully described later.

FIG. 2 is a diagram illustrating a portion of a memory device of FIG. 1 in detail according to example embodiments. Referring to FIGS. 1 and 2, the memory device 10 may include the memory cell array 12 in which a plurality of memory cells are arranged, the sense amplifier unit 100 connected to the memory cell array 12, a plurality of transistors CST connected to the column select line CSL, and the input/output buffer 15. Some components of the memory device 10 are illustrated in FIG. 2, and components included in the memory device 10 are not limited to the example of FIG. 2.

Each of the memory cells included in the memory cell array 12 may include a transistor and a capacitor. For example, a first memory cell MC1 may include a transistor TR1 having a gate connected to a wordline WL0, a first end connected to a bitline BL, and a second end connected to a capacitor CS1. The first memory cell MC1 may include the capacitor CS1 having a first end connected to the second end of the transistor TR1 and a second end connected to a ground voltage (e.g., a voltage VSS of FIG. 3 or a voltage GND of FIG. 5) or connected to a plate voltage Vp (e.g., ½ VINTA or a certain (or preset) voltage). As in the above description, a second memory cell MC2 may include a transistor TR2 and a capacitor CS2 connected to a wordline WL1 and the bitline BL, and a third memory cell MC3 may include a transistor TR3 and a capacitor CS3 connected to a wordline WL2 and the bitline BL.

Memory cells connected to the complementary bitline BLB may have the same structures as the memory cells connected to the bitline BL. To prevent a drawing from being unnecessarily complicated, memory cells of the bitline BL and memory cells of the complementary bitline BLB are illustrated as disposed adjacent to each other. However, the bitline BL may be disposed in a first array, and the complementary bitline BLB may be disposed in a second array. The sense amplifier unit 100 may be interposed between the first array and the second array. The bitline BL may extend toward the first array and may be connected to memory cells, and the complementary bitline BLB may extend toward the second array and may be connected to memory cells.

The data DQ input from the external device may be stored in each of the plurality of memory cells, based on the command/address CA received from the external device. For example, in the case where the external device intends to write data "1" in the first memory cell MC1, the external device may transmit the command/address CA, which includes the row address ADDR_R and the column address ADDR_C indicating the first memory cell MC1 and a write command, and the data DQ including data "1" to the memory device 10. The memory device 10 may charge a voltage corresponding to data "1" in the capacitor CS1 included in the first memory cell MC1, in response to the received command/address CA and the received data DQ.

Memory cells connected to the complementary bitline BLB may store data complementary to data stored in the memory cells connected to the bitline BL. When data "1" are stored in a specific memory cell of the bitline BL, data "0" may be stored in the corresponding memory cell of the complementary bitline BLB. Likewise, when data "0" are stored in the specific memory cell of the bitline BL, data "1" may be stored in the corresponding memory cell of the complementary bitline BLB.

In the embodiment that is illustrated in FIG. 2, a pair of bitline BL and complementary bitline BLB is illustrated by way of example. However, a plurality of pairs of bitlines BL and complementary bitlines BLB may be provided and may be connected to a plurality of memory cells.

In the embodiment that is illustrated in FIG. 2, the memory cell array 12 may further include a device isolation layer TRENCH. The device isolation layer TRENCH may isolate the plurality of memory cells included in the memory cell array 12 from each other. For example, the first memory cell MC1 may be electrically isolated from the second memory cell MC2 by the device isolation layer TRENCH. The device isolation layer TRENCH may be implemented with an isolator.

In the embodiment that is illustrated in FIG. 2, a transistor included in each of the plurality of memory cells may have a floating body structure. For example, a body (alternatively referred to as a "substrate" or a "bulk") of the transistor TR1 included in the first memory cell MC1 may not be biased. For example, the body of the transistor TR1 may be electrically floated. However, the invention is not limited to the embodiment illustrated in FIG. 2. Unlike the embodiment illustrated in FIG. 2, a body of a transistor included in a memory cell may be biased.

The sense amplifier unit 100 may include a bitline sense amplifier driver circuit 110, a bitline sense amplifier 120, and a voltage equalization circuit 130. Under control of the bitline sense amplifier driver circuit 110, the bitline sense amplifier 120 may sense and amplify a voltage corresponding to data stored in a capacitor of a target memory cell among a plurality of memory cells. For example, under control of the bitline sense amplifier driver circuit 110, the bitline sense amplifier 120 may read data stored in the memory cell array 12, may amplify the read data, and may temporarily store the amplified data. Operations of the bitline sense amplifier 120 and the bitline sense amplifier driver circuit 110 will be more fully described later.

The voltage equalization circuit 130 may equalize voltages applied to a pair of bitline BL and complementary bitline BLB before a sensing operation of the bitline sense amplifier 120. For example, when the precharge command is received from the external device, the voltage equalization circuit 130 may transfer a precharge voltage (e.g., half the driving voltage supplied to the memory device 10) to the bitline BL. As such, the bitline BL may be precharged with the precharge voltage.

The column select line CSL may be connected to gates of the plurality of transistors CST. When the command/address CA is received from the external device, the column select line CSL may turn on the transistor CST corresponding to a column (or a bitline) connected to a target memory cell. As such, a voltage that is sensed and amplified by the bitline sense amplifier 120 (i.e., data stored in the target memory cell) may be transmitted to the input/output buffer 15 through the turned-on transistor CST.

In an embodiment, in FIG. 2, when the command/address CA is received, the wordline WL0 may be activated, and the wordlines WL1 and WL2 may not be activated. For example, a voltage large enough to turn on the transistor TR1 may be supplied to the wordline WL0, and a smaller voltage (i.e., a voltage not large enough to turn on the transistors TR2 and TR3) may be supplied to the wordlines WL1 and WL2. As such, the transistor TR1 connected to the wordline WL0 may be turned on, and the transistors TR2 and TR3 may not be turned on.

After the wordline WL0 is activated, the bitline BL and the complementary bitline BLB may be developed by the sense amplifier unit 100. For example, a voltage of each of the bitline BL and the complementary bitline BLB may be set to a power supply voltage or a ground voltage. In an embodiment, assuming that the second memory cell MC2 stores data "0" and the third memory cell MC3 stores data "1", the capacitor CS2 may be charged with a voltage corresponding to data "0" (or may not be charged), and the capacitor CS3 may be charged with a voltage corresponding to data "1".

Because the transistors TR2 and TR3 are not turned on, channels of the transistors TR2 and TR3 may not be formed. In this case, the capacitor CS3 may be in a state of being charged with the voltage corresponding to data "1", for example, the power supply voltage, and a voltage of the wordline WL2 may be smaller than a threshold voltage of the transistor TR3. A gate induced drain leakage (GIDL) may occur under the above bias condition, In this case, holes may be generated on a surface or a curved surface of a drain of the transistor TR3 and may be injected into the body of the transistor TR3.

In the embodiment that is illustrated in FIG. 2, the transistors TR2 and TR3 may be of a floating body structure. Accordingly, the holes generated by the GIDL may be accumulated in the floating body of the transistor TR3. The accumulated holes may cause a potential (or a voltage) of the body of the transistor TR3 to increase. In the case where the ground voltage is applied to a source of the transistor TR3 (e.g., one end of the transistor TR3 connected to the bitline BL, in the embodiment illustrated in FIG. 2), due to the increased body potential, a forward-biased PN junction may occur between the source and the drain of the transistor TR3.

In the case where the voltage corresponding to data "1" is applied to the drain of the transistor TR3 by the capacitor CS3 and a voltage smaller than a threshold voltage of the transistor TR3 is applied to the gate of the transistor TR3, a reverse-biased PN junction may occur between the drain and the body of the transistor TR3. A parasitic BJT condition may be satisfied by the forward-biased PN junction between the source and the body of the transistor TR3 and the reverse-based PN junction between the drain and the body of the transistor TR3. For example, a first end of the transistor TR3 connected to the capacitor CS3 may operate as an emitter, the body of the transistor TR3 may operate as a base, and a second end of the transistor TR3 connected to the bitline BL may operate as a collector. As such, the transistor TR3 may operate as an NPN bipolar junction transistor (BJT). In this case, in the transistor TR3, charges may move from the emitter to the collector through the base. As a result, as charges being stored in the capacitor CS3 connected to the source of the transistor TR3 are leaked, data "1" stored in the capacitor CS3 may be lost.

A memory device according to an embodiment of the inventive concept may make a voltage of a low level developed by a bitline sense amplifier greater than the ground voltage during a given time while the bitline sense amplifier is operating. As a potential of a source of a transistor included in a memory cell is maintained to be greater than the ground voltage, the above GIDL phenomenon may become better. Also, the amount of holes accumulated in a body of a transistor with the floating body structure may decrease, and a reverse-biased PN junction may be maintained between one end of the transistor connected to a bitline and the body. As a result, the amount of leakage current of the memory cells in the memory cell array 12 may decrease, and data stored in the memory cells in the memory cell array 12 may be prevented from being lost. Accordingly, the reliability of the memory device 10 may be improved.

Figure 3:
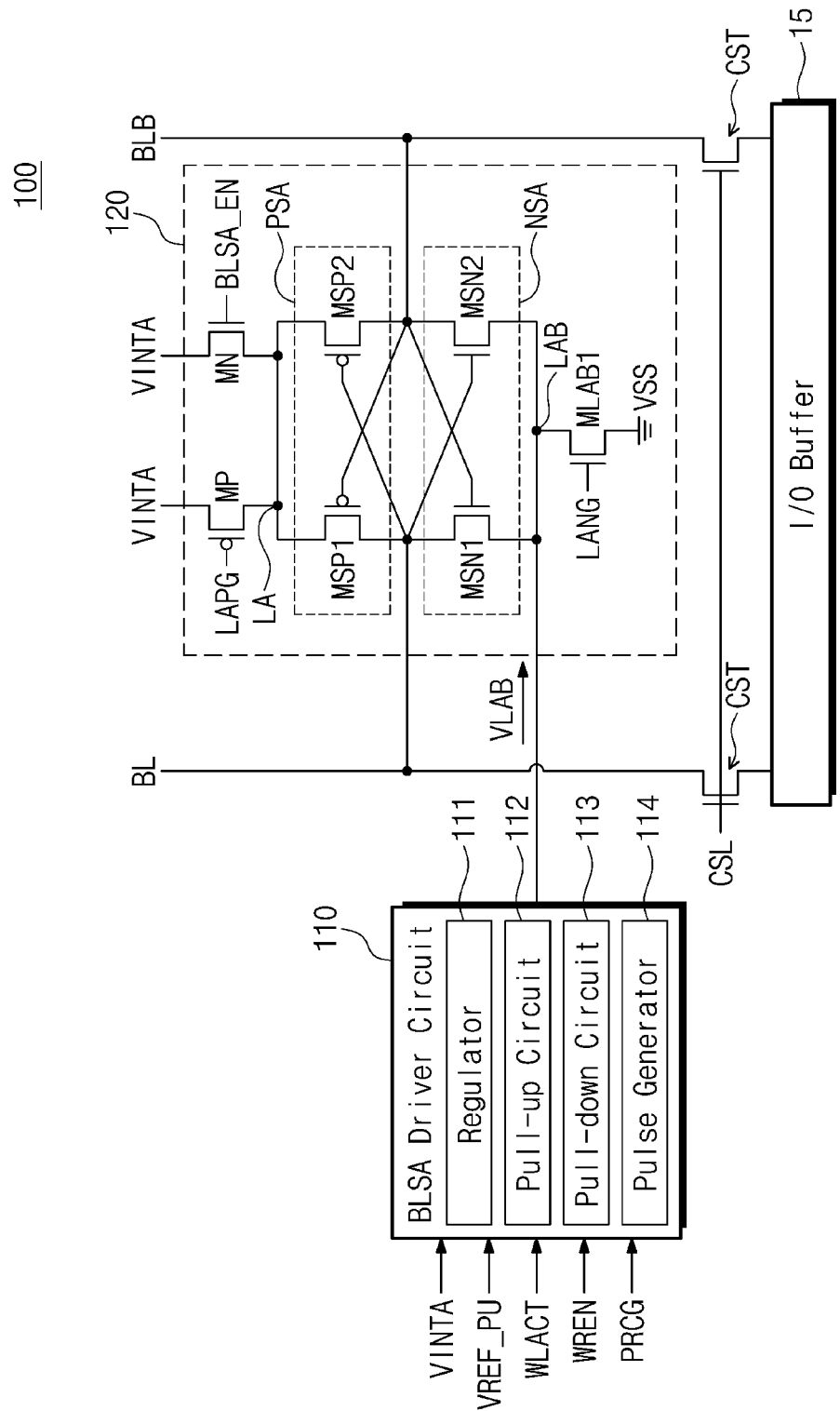
FIG. 3 illustrates a block diagram of a sense amplifier unit of FIG. 1 according to example embodiments.

FIG. 3 illustrates a block diagram of a sense amplifier unit of FIG. 1 according to example embodiments. Referring to FIGS. 1 to 3, the sense amplifier unit 100 may include the bitline sense amplifier 120 and the bitline sense amplifier driver circuit 110. For convenience of illustration, the remaining components (e.g., the voltage equalization circuit 130) of the sense amplifier unit 100 described with reference to FIG. 2 and peripheral components (e.g., the column decoder 14) are omitted in FIG. 3.

The bitline sense amplifier driver circuit 110 may include a regulator 111, a pull-up circuit 112, a pull-down circuit 113, and a pulse generator 114. The bitline sense amplifier driver circuit 110 may be connected to a node LAB of the bitline sense amplifier 120. The bitline sense amplifier driver circuit 110 may provide a voltage VLAB to the node LAB, based on the internal voltage VINTA, the pull-up reference voltage VREF_PU, the wordline active signal WLACT, the write enable signal WREN, and the precharge signal PRCG. As such, a voltage (i.e., VLAB) of the node LAB may be equal to a ground voltage VSS or may be greater than the ground voltage VSS. For example, the bitline sense amplifier driver circuit 110 may pull up the voltage VLAB of the node LAB to be greater than the ground voltage VSS or may pull down the voltage VLAB of the node LAB to be equal to the ground voltage VSS.

In the embodiment that is illustrated in FIG. 3, the bitline sense amplifier driver circuit 110 may include the pull-down circuit 113. However, another embodiment of the inventive concept may not include the pull-down circuit 113. In this case, the bitline sense amplifier driver circuit 110 may not pull down the voltage VLAB of the node LAB. Alternately, the voltage VLAB may be pulled down to the ground voltage VSS based on an operation of a transistor MLAB1 to be described later.

The bitline sense amplifier 120 may include transistors MP, MN, MSP1, MSP2, MSN1, MSN2, and MLAB1. The bitline sense amplifier 120 may include a first sensing unit PSA and a second sensing unit NSA. The first sensing unit PSA may include the transistors MSP1 and MSP2. The second sensing unit NSA may include the transistors MSN1 and MSN2. The transistors MSP1 and MSP2 of the first sensing unit PSA may be implemented with PMOS transistors. The transistors MSN1 and MSN2 of the second sensing unit NSA may be implemented with NMOS transistors.

The transistor MN may include a first end (e.g., a drain) to which the internal voltage VINTA from the voltage generator 16 is applied, a gate to which a bitline sense amplifier enable signal BLSA_EN from the pulse generator 114 is applied, and a second end (e.g., a source) connected to a node LA. In the embodiment that is illustrated in FIG. 3, the transistor MN may be implemented with an NMOS transistor.

The transistor MSP1 may include a first end (e.g., a source) connected to the node LA, a gate connected to the complementary bitline BLB, and a second end (e.g., a drain) connected to the bitline BL. The transistor MSP2 may include a first end (e.g., a source) connected to the node LA, a gate connected to the bitline BL, and a second end (e.g., a drain) connected to the complementary bitline BLB. The transistor MSN1 may include a first end (e.g., a drain) connected to the bitline BL, a gate connected to the complementary bitline BLB, and a second end (e.g., a source) connected to the node LAB. The transistor MSN2 may include a first end (e.g., a drain) connected to the complementary bitline BLB, a gate connected to the bitline BL, and a second end (e.g., a source) connected to the node LAB.

The first sensing unit PSA and the second sensing unit NSA may sense data stored in a memory cell with which a bitline pair BL and BLB is connected. Operations of the first sensing unit PSA and the second sensing unit NSA will be more fully described later.

A voltage level of the bitline BL may be changed from the precharge voltage charged by the voltage equalization circuit 130 through the charge sharing between the bitline BL and the first memory cell MC1. The first sensing unit PSA and the second sensing unit NSA may sense a change of the voltage level of the bitline BL.

The transistor MP may include a first end (e.g., a source) to which the internal voltage VINTA from the voltage generator 16 is applied, a gate to which a develop signal LAPG from the pulse generator 114 is applied, and a second end (e.g., a drain) connected to the node LA. In the embodiment that is illustrated in FIG. 3, the transistor MP may be implemented with a PMOS transistor.

The transistor MLAB1 may include a first end (e.g., a drain) connected to the node LAB of the bitline sense amplifier 120, a gate to which a develop signal LANG from the pulse generator 114 is applied, and a second end (e.g., a source) to which the ground voltage VSS is applied.

The regulator 111 of the bitline sense amplifier driver circuit 110 may adjust a level of a voltage (e.g., a pull-up gate voltage PU_N of FIG. 4) to be supplied to the pull-up circuit 112, based on the internal voltage VINTA and the pull-up reference voltage VREF_PU. The pull-up circuit 112 may pull up a level of the voltage VLAB, based on a voltage supplied from the regulator 111 and a signal applied from the pulse generator 114. The pull-down circuit 113 may pull down a level of the voltage VLAB to the same level as the ground voltage VSS, based on a signal applied from the pulse generator 114. The pulse generator 114 may generate various signals (e.g., the bitline sense amplifier enable signal BLSA_EN and the develop signals LAPG and LANG) to be used in the sense amplifier unit 100, based on the signals WLACT, WREN, and PRCG received from the control logic 11. Operations of the regulator 111, the pull-up circuit 112, the pull-down circuit 113, and the pulse generator 114 will be more fully described later.

Figure 4:
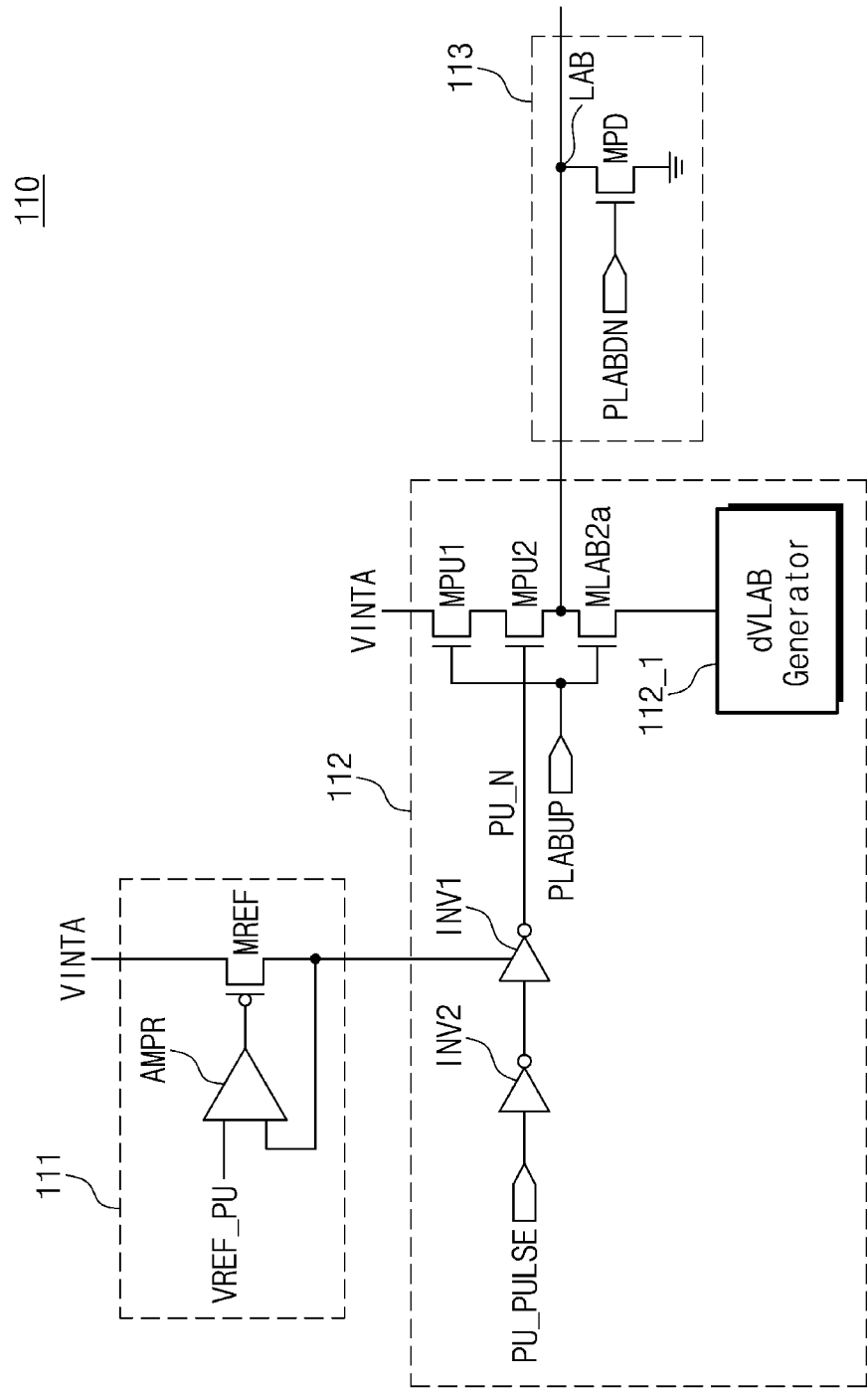
FIG. 4 illustrates a circuit diagram of a bitline sense amplifier driver circuit of FIG. 3 according to example embodiments.

FIG. 4 illustrates a circuit diagram of a bitline sense amplifier driver circuit of FIG. 3 according to example embodiments. Referring to FIGS. 1 to 4, the bitline sense amplifier driver circuit 110 may include the regulator 111, the pull-up circuit 112, and the pull-down circuit 113. For convenience of illustration, the pulse generator 114 is omitted.

The regulator 111 may include an amplifier AMPR and a transistor MREF. The transistor MREF may include a first end (e.g., a source) to which the internal voltage VINTA from the voltage generator 16 is applied, a gate to which an output terminal of the amplifier AMPR is connected, and a second end (e.g., a drain) connected to the pull-up circuit 112. In the embodiment that is illustrated in FIG. 4, the transistor MREF may be implemented with a PMOS transistor.

The amplifier AMPR may include a first input terminal to which the pull-up reference voltage VREF_PU from the voltage generator 16 is applied, a second input terminal connected to the pull-up circuit 112, and the output terminal connected to the gate of the transistor MREF. The pull-up reference voltage VREF_PU may be a DC voltage.

Unlike the embodiment illustrated in FIG. 4, according to another embodiment of the inventive concept, a voltage having a level different from that of the internal voltage VINTA may be applied to the first end of the transistor MREF from the voltage generator 16. For example, the voltage generator 16 may apply the received external voltage VEXT to the first end of the transistor MREF.

In an embodiment, a level of the pull-up reference voltage VREF_PU may be determined based on a characteristic of a die (or a chip) in which the memory cell array 12 is implemented. For example, a level of the pull-up reference voltage VREF_PU may be determined such that, due to the process, voltage and temperature variation, differences between physical characteristics of one or more dies where the memory cell array 12 is implemented cancel out. For another example, a level of the pull-up reference voltage VREF_PU may be determined to cancel out, in one die, a process error, which occurs during a process of manufacturing the die, such as an irregular surface or height or the like of a substrate.

The pull-up circuit 112 may include inverters INV1 and INV2, pull-up transistors MPU1, MPU2, and MLAB2a, and a delta voltage generator 112_1. The inverter INV2 may receive a pull-up pulse PU_PULSE from the pulse generator 114. The inverter INV2 may output a voltage to the inverter INV1 in response to the pull-up pulse PU_PULSE. The inverter INV1 may output the pull-up gate voltage PU_N to a gate of the transistor MPU2 in response to the voltage received from the inverter INV2 and a voltage received from the second end of the transistor MREF.

The pull-up transistor MPU1 may include a first end (e.g., a drain) to which the internal voltage VINTA from the voltage generator 16 is applied, a gate to which a pull-up pulse PLABUP is applied, and a second end (e.g., a source) connected to a first end (e.g., a drain) of the pull-up transistor MPU2. In the embodiment that is illustrated in FIG. 4, the pull-up transistor MPU1 may be implemented with an NMOS transistor.

When the pull-up pulse PLABUP is not applied to the gate of the pull-up transistor MPU1, a current may not flow from the first end to the second end of the pull-up transistor MPU1. Accordingly, during a time interval where the pull-up pulse PLABUP is not applied from the pulse generator 114, a current may be prevented from being leaked from the pull-up transistor MPU1 to the pull-up transistor MPU2. As a result, when the pull-up pulse PLABUP is not applied, a current based on the internal voltage VINTA may be prevented from being leaked to the bitline sense amplifier 120 through the pull-up transistors MPU1 and MPU2.

The pull-up transistor MPU2 may include a first end (e.g., a drain) connected to the second end of the pull-up transistor MPU1, a gate to which the pull-up gate voltage PU_N is applied, and a second end (e.g., a source) connected to a first end (e.g., a drain) of the pull-up transistor MLAB2a and the node LAB. When a magnitude of the pull-up gate voltage PU_N is greater than a magnitude of a threshold voltage of the pull-up transistor MPU2, the pull-up transistor MPU22 may be turned on. In the embodiment that is illustrated in FIG. 4, the pull-up transistor MPU22 may be implemented with an NMOS transistor.

The pull-up transistor MLAB2a may include the first end (e.g., a drain) connected to the second end of the pull-up transistor MPU2 and the node LAB, a gate to which the pull-up pulse PLABUP is applied, and a second end (e.g., a source) connected to the delta voltage generator 112_1.

The delta voltage generator 112_1 may provide the voltage VLAB, which is greater than the ground voltage VSS as much as a delta voltage (e.g., dVLABa of FIG. 6A or dVLABb of FIG. 6B), to the node LAB through the pull-up transistor MLAB2a. As a result, the pull-up circuit 112 may pull up the voltage VLAB of the node LAB from the ground voltage VSS to a voltage greater than the ground voltage VSS by supplying a voltage generated from the delta voltage generator 112_1 to the node LAB in response to the pull-up pulses PU_PULSE and PLABUP. An operation of the delta voltage generator 112_1 will be more fully described with reference to FIGS. 6A and 6B.

The pull-down circuit 113 may include a pull-down transistor MPD. The pull-down transistor MPD may include a first end (e.g., a drain) connected to the node LAB, a gate to which a pull-down pulse PLABDN from the pulse generator 114 is applied, and a second end (e.g., a source) connected to the ground voltage VSS.

Figure 5:
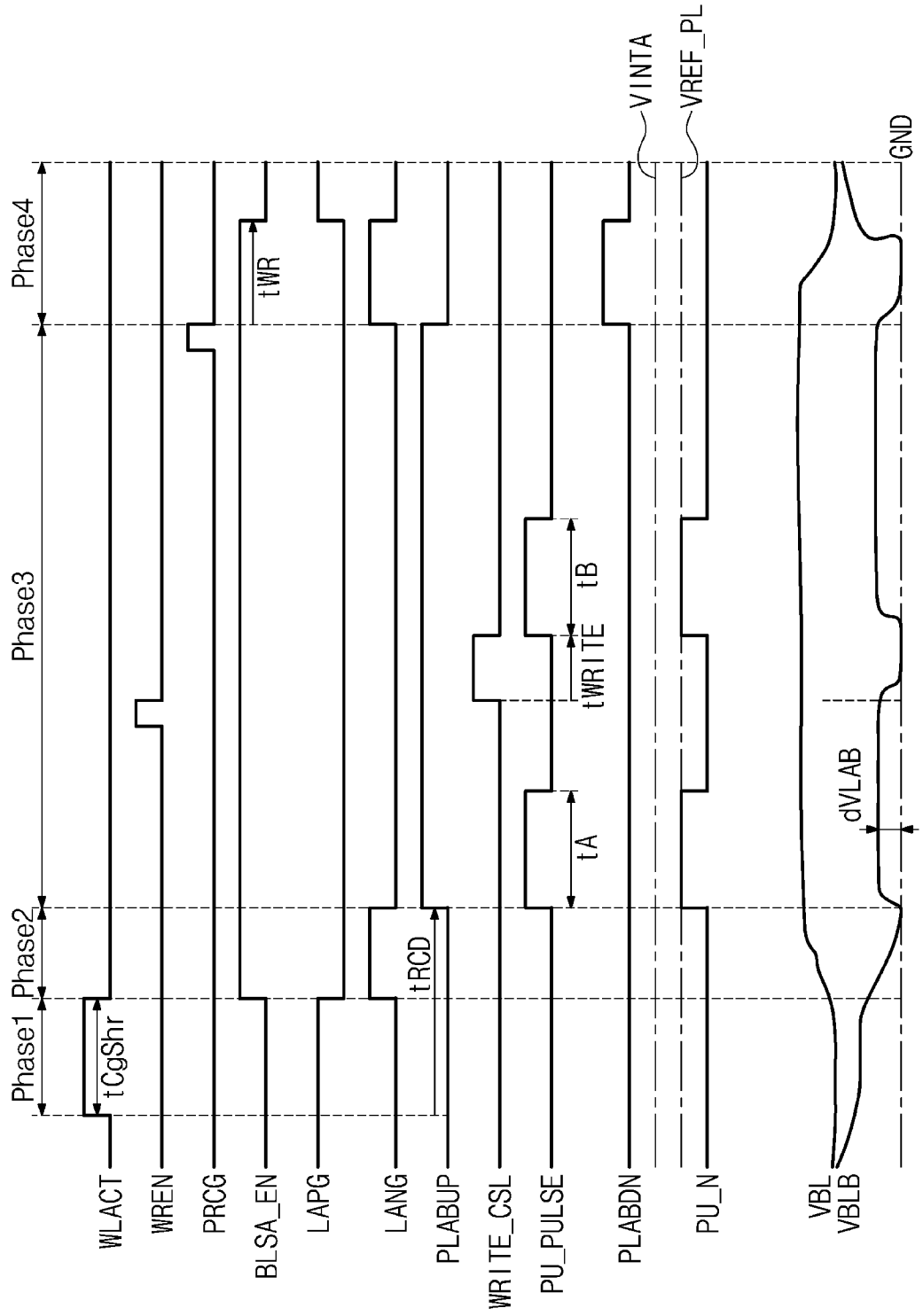
FIG. 5 illustrates a timing diagram of waveforms of a signal applied to a bitline sense amplifier driver circuit, signals used in the bitline sense amplifier driver circuit, a voltage of a bitline, and a voltage of a complementary bitline, according to example embodiments.

FIG. 5 illustrates a timing diagram of waveforms of a signal applied to a bitline sense amplifier driver circuit, signals used in the bitline sense amplifier driver circuit, a voltage of a bitline, and a voltage of a complementary bitline, according to example embodiments. FIG. 5 will be described with reference to FIGS. 1 to 4.

In a first phase Phase1 or in a charge sharing operation mode, the control logic 11 may generate the wordline active signal WLACT in response to the command/address CA requesting the activation of a wordline (e.g., WL0). In the embodiment that is illustrated in FIG. 5, a high level of the wordline active signal WLACT may be maintained during a time period tCgShr. As the wordline active signal WLACT is activated, the voltage VBL precharged at the bitline BL may be shared with a voltage charged in a capacitor (e.g., CS1) of a memory cell (e.g., MC1) connected to the wordline WL0 and the bitline BL through the process of charge sharing.

For example, as illustrated in FIG. 2, the memory device 10 may receive an access request for the wordline WL0 connected to the first memory cell MC1 from the external device. In this case, the memory device 10 may receive the command/address CA including the row address ADDR_R of the first memory cell MC1 and the active command. As the command/address CA is received, a voltage, the level of which is equal to or higher than that of a sum of a driving voltage of the memory device 10 and a turn-on voltage of a transistor in a memory cell, may be supplied to the wordline WL0. As such, transistors (e.g., TR1) connected to the wordline WL0 may be turned on.

Assuming that data "1" is stored in the first memory cell MC1, as the transistor TR1 is turned on, a voltage (corresponding to data "1") stored in the capacitor CS1 may be transferred to the bitline BL through the transistor TR1. In contrast, assuming that data "0" is stored in the first memory cell MC1 (i.e., assuming that the capacitor CS1 is not charged), as the transistor TR1 is turned on, a voltage charged at the bitline BL may be transferred to the capacitor CS1. In other words, as the wordline WL0 is activated, charges of the capacitor CS1 of the first memory cell MC1 may be shared with charges of the bitline BL, the charges which were charged by the voltage equalization circuit 130, through the process of charge sharing.

In a second phase Phase2, or in a sensing operation mode, after the time period tCgShr from a time when the wordline active signal WLACT transitions to the high level, the bitline sense amplifier enable signal BLSA_EN and the develop signal LANG may transition to the high level, and the develop signal LAPG may transition to a low level.

The transistor MP of the bitline sense amplifier 120 may be turned on in response to the low level of the develop signal LAPG. For example, as illustrated in FIG. 3, when the develop signal LAPG is applied to the gate of the transistor MP, the internal voltage VINTA may be supplied to the first sensing unit PSA of the bitline sense amplifier 120 through the transistor MP. As such, a voltage level of the bitline BL may increase. In this case, the voltage level of the bitline BL may be a voltage level corresponding to data "1". For example, the bitline sense amplifier 120 may develop the voltage of the bitline BL to the voltage corresponding to data "1" in response to the develop signal LAPG.

The transistor MN may be turned on in response to the high level of the bitline sense amplifier enable signal BLSA_EN. For example, as illustrated in FIG. 3, when the bitline sense amplifier enable signal BLSA_EN is applied to the gate of the transistor MN, the internal voltage VINTA may be supplied to the bitline sense amplifier 120 through the transistor MN. As such, the bitline sense amplifier 120 may be driven.

The transistor MLAB1 may be turned on in response to the develop signal LANG. As such, the voltage VBL of the bitline BL may increase, and a voltage VBLB of the complementary bitline BLB may decrease (corresponding to data "1").

In a third phase Phase3, the pull-up pulses PLABUP and PU_PULSE may transition from the low level to the high level, and the develop signal LANG may transition from the high level to the low level. In response to the pull-up pulse PU_PULSE, the pull-up gate voltage PU_N may be applied to the pull-up transistor MPU2. For example, a read operation or a write operation may be performed in the third phase Phase3.

For example, as illustrated in FIG. 4, when the pull-up pulse PLABUP is applied to the pull-up transistor MLAB2a, the pull-up transistor MLAB2a may be turned on. As such, the voltage VLAB generated by the delta voltage generator 112_1 may be provided to the node LAB through the pull-up transistor MLAB2a.

In an embodiment, the pull-up pulses PLABUP and PU_PULSE may transition to the high level after at least a time tRCD from a time when the pulse generator 114 receives the wordline active signal WLACT from the control logic 11. The time tRCD may be between the issuing of the active command and the read/write command. The time tRCD may be a time necessary for the sense amplifier unit 100 to sense and amplify data stored in the first memory cell MC1. The wordline active signal WLACT (e.g., the selected word line WL0) may be transited to a high level in response to the active command ACT. As such, the time tRCD may be sufficiently secured. The pull-up pulse PU_PULSE may have the high level during a time period tA. The time period tA may be an adjusted delay time delayed by an adjustable delay circuit DA (refer to FIG. 7).

The transistor MLAB1 may be turned off in response to the low level of the develop signal LANG. The pull-up transistors MPU1, MPU2, and MLAB2a may be turned on in response to the pull-up pulses PU_PULSE and PLABUP and the pull-up gate voltage PU_N. As such, the voltage VBLB of the complementary bitline BLB may be pulled up from the ground voltage GND by the delta voltage generator 112_1 as much as a delta voltage dVLAB.

When the pull-up pulse PU_PULSE again transitions to the low level after the time period to passes, a magnitude of the pull-up gate voltage PU_N may decrease. As such, the pull-up transistor MPU22 may be turned off. When the pull-up transistor MPU2 is turned off, the delta voltage dVLAB may not be supplied to the bitline sense amplifier 120. As such, the voltage VBLB of the complementary bitline BLB may again decrease to the ground voltage VSS after a given time passes.

In an example embodiment, the control logic 11 may generate the write enable signal WREN in response to the command/address CA for writing data in a memory cell (e.g., MC1) connected to a wordline (e.g., WL0) activated by the wordline active signal WLACT and the bitline BL. A write column select signal WRITE_CSL may be applied to the column select line CSL in response to the write enable signal WREN. The sense amplifier unit 100 may write new data in a target memory cell in response to the write column select signal WRITE_CSL. For example, the sense amplifier unit 100 may charge a voltage corresponding to the new data in a capacitor (e.g., CS1) of a memory cell (e.g., MC1) connected to a bit line (e.g., BL) corresponding to the write column select signal WRITE_CSL from among a plurality of bitlines.

Alternatively, the sense amplifier unit 100 may restore data stored in respective memory cells connected to the wordline (e.g., WL0) activated by the wordline active signal WLACT in the respective memory cells. For example, the sense amplifier unit 100 may again charge voltages corresponding to data sensed by the bitline sense amplifier 120 in capacitors in the memory cells, respectively.

To perform a write operation on new data as the write column select signal WRITE_CSL transitions to the high level, there may be a need to pull down a level of a voltage VBL/VBLB of the bitline BL/complementary bitline BLB to a level of the ground voltage VSS during a given time. In the embodiment that is illustrated in FIG. 5, a level of the voltage VBLB of the complementary bitline BLB may be pulled down to the level of the ground voltage VSS.

After a time tWRITE passes from a time when the write column select signal WRITE_CSL transitions to the high level, the pull-up pulse PU_PULSE may have the high level during a time period tB. The time tWRITE may be a time necessary for the sense amplifier unit 100 to write new data in a target memory cell. The time period tB may be an adjusted delay time delayed by the adjustable delay circuit DA (refer to FIG. 7).

In response to the pull-up pulse PU_PULSE, the pull-up gate voltage PU_N may be applied to the pull-up transistor MPU2. The pull-up transistor MPU22 may again be turned on in response to the pull-up gate voltage PU_N. As such, the delta voltage dVLAB may be supplied to the bitline sense amplifier 120 by the delta voltage generator 112_1, and thus, the voltage VBLB of the complementary bitline BLB may again be pulled up as much as the delta voltage dVLAB.

In an example embodiment, in the third phase Phase3, the memory device 10 may perform a read operation in response to the command/address CA. For example, the external device may transmit the command/address CA, which includes the column address ADDR_C indicating the first memory cell MC1 and a read command. For example, the memory device 10 may perform a read operation in response to the command/address CA. In a read operation, the sense amplifier unit 100 may transmit the amplified data of a difference between a voltage of the bitline BL and a voltage of the complementary bitline BLB to the input/output buffer 15.

The control logic 11 may transmit the precharge signal PRCG to the sense amplifier unit 100 in response to the command/address CA requesting the precharge operation.

In a fourth phase Phase4, or in a precharge operation mode, the pull-up pulse PLABUP may transition to the low level, and the develop signal LANG and the pull-down pulse PLABDN may transition to the high level. The transistor MLAB1 may be turned on in response to the high level of the develop signal LANG. The transistor MPD may be turned on in response to the high level of the pull-down pulse PLABDN. For example, when the pull-down pulse PLABDN is applied to the pull-down transistor MPD, the pull-down transistor MPD may be turned on. As such, the voltage VLAB of the node LAB may be pulled down to the ground voltage GND. For example, the pull-down circuit 113 may pull down the voltage VLAB in response to the pull-down pulse PLABDN received from the pulse generator 114. As the transistors MLAB1 and MPD are turned on, the voltage VLAB of the complementary bitline BLB may be pulled down to the level of the ground voltage VSS.

In the embodiment that is illustrated in FIG. 5, the develop signal LANG and the pull-down pulse PLABDN may have the high level during a time tWR. As such, the time tWR necessary for the memory device 10 to perform a write restore operation may be sufficiently secured.

After the time tWR passes from a time when the develop signal LANG and the pull-down pulse PLABDN transition to the high level, the bitline sense amplifier enable signal BLSA_EN, the develop signal LANG, and the pull-down pulse PLABDN may transition to the low level, and the develop signal LAPG may transition to the high level. As such, the internal voltage VINTA may not be supplied to the bitline sense amplifier 120. For example, the bitline sense amplifier 120 may be deactivated. The voltage equalization circuit 130 may equalize the voltages VBL and VBLB of the bitline BL and the complementary bitline BLB to the precharge voltage in response to the precharge signal PRCG.

Figure 6A:
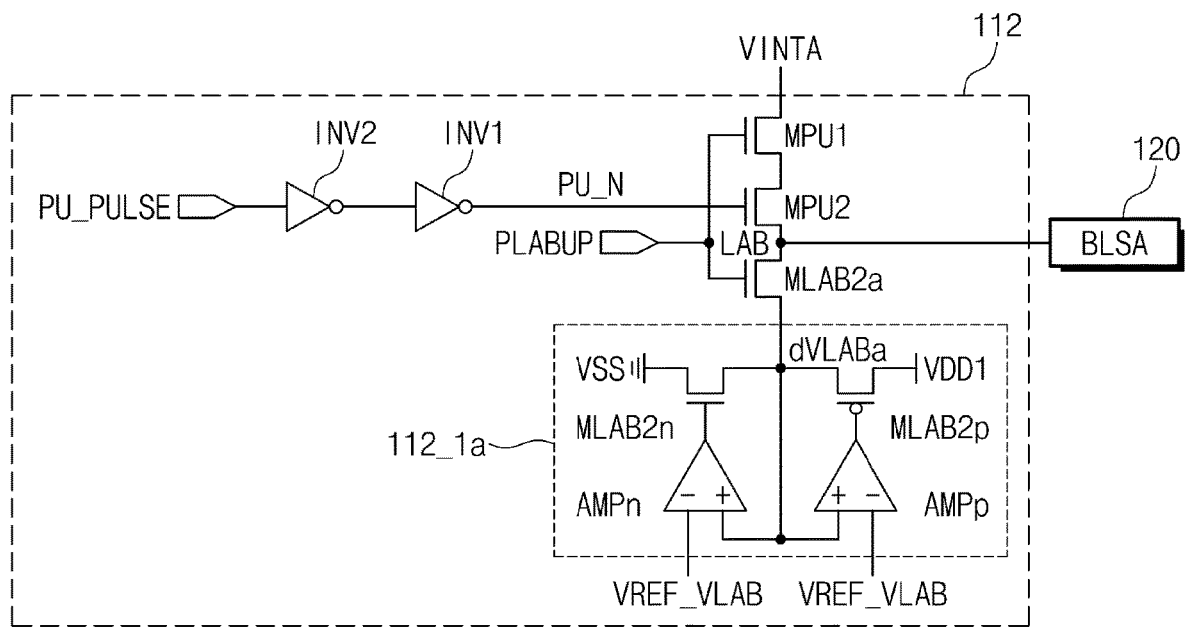
FIG. 6A illustrates a pull-up circuit of FIG. 4 in detail, according to an embodiment of the inventive concept.
Figure 6B:
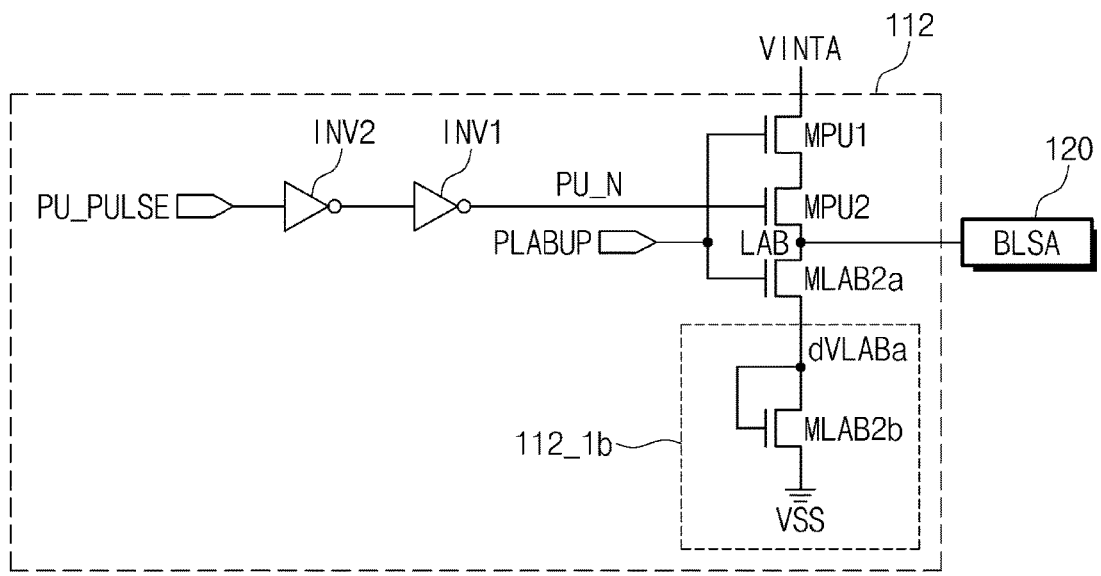
FIG. 6B illustrates a pull-up circuit of FIG. 4 in detail, according to another embodiment of the inventive concept.

FIG. 6A illustrates a pull-up circuit of FIG. 4 in detail, according to an embodiment of the inventive concept. FIG. 6B illustrates a pull-up circuit of FIG. 4 in detail, according to another embodiment of the inventive concept. Referring to FIGS. 1 to 4, 6A, and 6B, the pull-up circuit 112 may include delta voltage generators 112_1a and 1121b.

In the embodiment that is illustrated in FIG. 6A, the delta voltage generator 112_1a may include transistors MLAB2n and MLAB2p and amplifiers AMPn and AMPp. In the embodiment that is illustrated in FIG. 6A, the transistor MLAB2n may be implemented with an NMOS transistor, and the transistor MLAB2p may be implemented with a PMOS transistor. In the embodiment that is illustrated in FIG. 6A, the amplifiers AMPn and AMPp may be implemented with a class AB amplifier or a class B amplifier.

The transistor MLAB2n may include a first end (e.g., a drain) connected to the second end of the pull-up transistor MLAB2a, a gate connected to an output terminal of the amplifier AMPn, and a second end (e.g., a source) connected to the ground voltage VSS. The transistor MLAB2p may include a first end (e.g., a source) connected to a voltage VDD1, a gate connected to an output terminal of the amplifier AMPp, and a second end (e.g., a drain) connected to the second end of the pull-up transistor MLAB2a. In an embodiment, the internal voltage VINTA may be applied to the first end of the transistor MLAB2p instead of the voltage VDD1.

The amplifier AMPn may include a first input terminal to which a reference voltage VREF_VLAB is applied, a second input terminal connected to the second end of the pull-up transistor MLAB2a, and an output terminal connected to the gate of the transistor MLAB2n. The amplifier AMPp may include a first input terminal to which the reference voltage VREF_VLAB is applied, a second input terminal connected to the second end of the pull-up transistor MLAB2a, and an output terminal connected to the gate of the transistor MLAB2p.

In the embodiment that is illustrated in FIG. 6A, the reference voltage VREF_VLAB may be generated by the voltage generator 16 and may be supplied to the amplifiers AMPn and AMPp. The amplifiers AMPn and AMPp may amplify the delta voltage dVLABa based on the reference voltage VREF_VLAB and may output the amplified voltage. When a level of the voltage amplified by the amplifiers AMPn and AMPp is great enough to turn on the transistors MLAB2n and MLAB2p, the transistors MLAB2n and MLAB2p may be turned on. As such, a magnitude of the delta voltage dVLAB of FIG. 4 applied to the second end of the pull-up transistor MLAB2a may change. For example, the magnitude of the delta voltage dVLAB may be adjusted based on the operations of the amplifiers AMPn and AMPp. The adjusted delta voltage dVLAB may be supplied to the node LAB of the bitline sense amplifier 120 through the pull-up transistor MLAB2a in response to the pull-up pulses PU_PULSE and PLABUP. In the embodiment that is illustrated in FIG. 6B, the delta voltage generator 112_1b may include a transistor MLAB2b. The transistor MLAB2b may be implemented with an NMOS transistor. The transistor MLAB2b may include a first end (e.g., a drain) connected to the second end of the pull-up transistor MLAB2a, a gate connected to the second end of the pull-up transistor MLAB2a, and a second end (e.g., a source) connected to the ground voltage VSS. In this case, the transistor MLAB2b may be diode-connected.

In the embodiment that is illustrated in FIG. 6B, when the pull-up transistors MPU1 and MLAB2a are turned on in response to the pull-up pulse PLABUP and the pull-up transistor MPU2 is turned on in response to the pull-up pulse PU_PULSE, that is, the pull-up gate voltage PU_N, a current based on the internal voltage VINTA may be transferred to the transistor MLAB2b through the pull-up transistors MPU1, MPU2, and MLAB2a. In this case, the delta voltage dVLABb applied to the gate and the first end of the transistor MLAB2b may be equal to the threshold voltage of the transistor MLAB2b. As a result, the delta voltage dVLABb greater than the ground voltage VSS as much as the threshold voltage of the transistor MLAB2b may be supplied to the node LAB of the bitline sense amplifier 120 through the transistor MLAB2a in response to the pull-up pulses PU_PULSE and PLABPU.

In the embodiment that is illustrated in FIG. 6B, a level of the pull-up gate voltage PU_N may be equal to a level of the pull-up reference voltage VREF_PU. The pull-up reference voltage VREF_PU may be smaller than the internal voltage VINTA. Levels of the pull-up reference voltage VREF_PU and the internal voltage VINTA may be adjusted by the voltage generator 16. For example, the voltage generator 16 may adjust a level of the pull-up gate voltage PU_N to be supplied from the regulator 111 to the pull-up circuit 112 by adjusting levels of the pull-up reference voltage VREF_PU and the internal voltage VINTA transmitted to the regulator 111.

As the level of the pull-up gate voltage PU_N is adjusted, a magnitude of the voltage VLAB to be pulled up by the pull-up circuit 112 may be adjusted. For example, as illustrated in FIG. 4, the voltage generator 16 may adjust a level of a voltage to be output from the amplifier AMPR to the gate of the transistor MREF by adjusting a level of the pull-up reference voltage VREF_PU. As such, whether to turn on the transistor MREF may be determined. When the transistor MREF is turned on, a voltage that is determined based on the internal voltage VINTA and the pull-up reference voltage VREF_PU may be supplied to the pull-up circuit 112 through the transistor MREF. A voltage that is supplied from the regulator 111 to the pull-up circuit 112 may be applied to the gate of the pull-up transistor MPU2 through the inverters INV2 and INV1. A configuration of the delta voltage generator 112_1 is not limited to the embodiments illustrated in FIGS. 6A and 6B. Accordingly, the voltage VLAB may be pulled up to a voltage of an appropriate level in a manner different from those of the embodiment illustrated in FIGS. 6A and 6B in consideration of the performance of the memory device 10.

Figure 7:
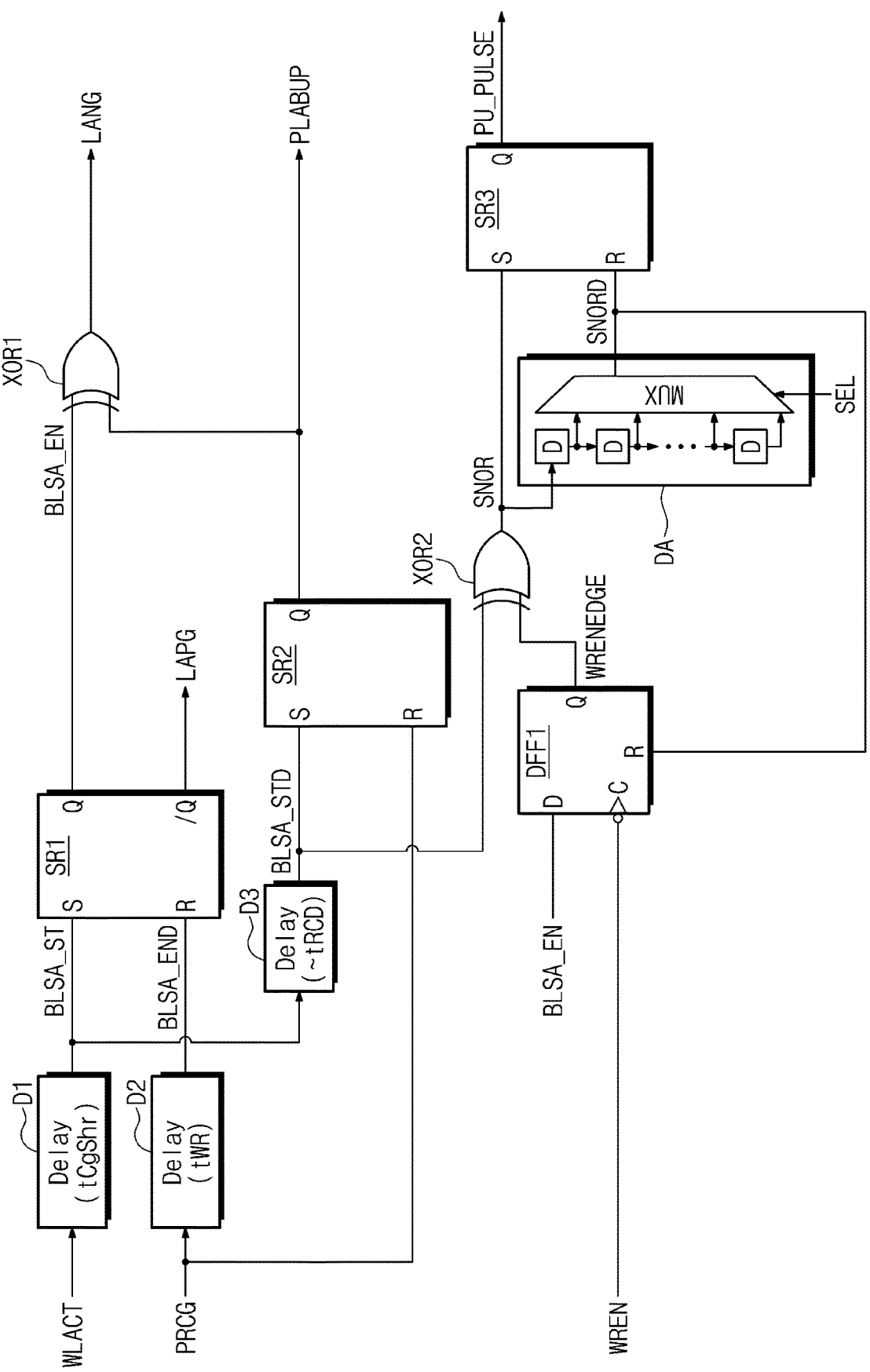
FIG. 7 illustrates a block diagram of a pulse generator of FIG. 4 according to example embodiments.

FIG. 7 illustrates a block diagram of a pulse generator of FIG. 4 according to example embodiments. Referring to FIGS. 1 to 5 and 7, the pulse generator 114 may include delay circuits D1 to D3, latches SR1 to SR3, a flip-flop DFF1, XOR gates XOR1 and XOR2, and the adjustable delay circuit DA.

In the embodiment that is illustrated in FIG. 7, the latches SR1 to SR3 may be implemented with an SR latch. In the embodiment that is illustrated in FIG. 7, the flip-flop DFF1 may be implemented with a D flip-flop. In an embodiment, each of the delay circuits D1 to D3 may include one or more buffers connected in series. In this case, the number of buffers included in each of the delay circuits D1 to D3 may be determined based on a length of a time to be delayed by each of the delay circuits D1 to D3. The embodiment illustrated in FIG. 7 is exemplary, and a configuration of the pulse generator 114 according to an embodiment of the inventive concept is not limited thereto.

The delay circuit D1 may receive the wordline active signal WLACT from the control logic 11. After the time period tCgShr passes from a time when the delay circuit D1 receives the wordline active signal WLACT, the delay circuit D1 may output the received wordline active signal WLACT as a signal BLSA_ST to the latch SR1 and the delay circuit D3. In an embodiment, the time period tCgShr may be a time necessary for the charge sharing between the bitline BL and a capacitor (e.g., CS1 of FIG. 2) included in a memory cell (e.g., MC1 of FIG. 2) connected to an activated word line (e.g., WL0 of FIG. 2) and the bitline BL when the wordline is activated.

The delay circuit D2 may receive the precharge signal PRCG from the control logic 11. After the time tWR passes from a time when the delay circuit D2 receives the precharge signal PRCG, the delay circuit D2 may output the received precharge signal PRCG as a signal BLSA_END to the latch SR1. In an embodiment, the time tWR may be a write recovery time.

The delay circuit D3 may receive the signal BLSA_ST from the delay circuit D1. After at least the tRCD passes from a time when the delay circuit D1 receives the wordline active signal WLACT, the delay circuit D3 may output the received signal BLSA_ST as a signal BLSA_STD to the latch SR2 and the XOR gate XOR2. In an embodiment, the time tRCD may be a RAS-to-CAS delay.

The latch SR1 may receive the signal BLSA_ST from the delay circuit D1. The latch SR1 may receive the signal BLSA_END from the delay circuit D2. The latch SR1 may output the bitline sense amplifier enable signal BLSA_EN and the develop signal LAPG based on the received signals BLSA_ST and BLSA_END.

In the embodiment that is illustrated in FIG. 7, the latch SR1 may use the signal BLSA_ST as a set signal and may use the signal BLSA_END as a reset signal. The latch SR1 may latch the received signals BLSA_ST and BLSA_END and may output the bitline sense amplifier enable signal BLSA_EN to the XOR gate XOR1. The latch SR1 may output the develop signal LAPG by inverting the bitline sense amplifier enable signal BLSA_EN. The develop signal LAPG may be transmitted to the bitline sense amplifier 120.

The latch SR2 may receive the signal BLSA_STD from the delay circuit D3. The latch SR2 may receive the precharge signal PRCG from the control logic 11. The latch SR2 may output the pull-up pulse PLABUP based on the received signals BLSA_STD and PRCG.

In the embodiment that is illustrated in FIG. 7, the latch SR2 may use the signal BLSA_STD as a set signal and may use the precharge signal PRCG as a reset signal. The latch SR2 may output the pull-up pulse PLABUP by latching the received signals BLSA_STD and PRCG. The pull-up pulse PLABUP may be transmitted to the XOR gate XOR1 and the pull-up circuit 112.

The XOR gate XOR1 may receive the bitline sense amplifier enable signal BLSA_EN from the latch SR1. The XOR gate XOR1 may receive the pull-up pulse PLABUP from the latch SR2. The XOR gate XOR1 may output the develop signal LANG to the bitline sense amplifier 120 based on the bitline sense amplifier enable signal BLSA_EN and the pull-up pulse PLABUP.

The flip-flop DFF1 may receive the bitline sense amplifier enable signal BLSA_EN from the latch SR1. The flip-flop DFF1 may receive the write enable signal WREN from the control logic 11. The flip-flop DFF1 may receive a signal SNORD from the adjustable delay circuit DA. In an embodiment, the flip-flop DFF1 may be a negative edge-triggered flip-flop. The flip-flop DFF1 may output a signal WRENEDGE to the XOR gate XOR2 based on the signals BLSA_STD, WREN, and SNORD.

In the embodiment that is illustrated in FIG. 7, the flip-flop DFF1 may use the signal BLSA_EN as a data input. The flip-flop DFF1 may use the write enable signal WREN as a clock input. The flip-flop DFF1 may use the signal SNORD as a reset signal. In response to a falling edge of the write enable signal WREN, the flip-flop DFF1 may output the signal WRENEDGE to the XOR gate XOR2 based on the signals BLSA_EN and SNORD.

The XOR gate XOR2 may receive the signal BLSA_STD from the delay circuit D3. The XOR gate XOR2 may receive the signal WRENEDGE from the flip-flop DFF1. The XOR gate XOR2 may output a signal SNOR to the latch SR3 and the adjustable delay circuit DA based on the signals BLSA_STD and WRENEDGE.

The adjustable delay circuit DA may receive the signal SNOR. After an adjusted delay time from a time when the adjustable delay circuit DA receives the signal SNOR, the adjustable delay circuit DA may output the signal SNOR as the signal SNORD to the latch SR3. In this case, a level of the voltage VLAB may depend on a length of the adjusted delay time.

In an embodiment, the adjusted delay time delayed by the adjustable delay circuit DA may be determined based on a characteristic of a die where the memory cell array 12 is implemented. For example, the adjusted delay time may be determined in a manner similar to a manner to determine a level of the pull-up reference voltage VREF_PU described above.

In the embodiment that is illustrated in FIG. 7, the adjustable delay circuit DA may include a plurality of delay circuits "D" connected in series and a multiplexer MUX. A manner where the adjustable delay circuit DA is capable of being implemented is not limited to the embodiment illustrated in FIG. 7.

Each of the delay circuits "D" in the adjustable delay circuit DA may output a received signal to the multiplexer MUX and the delay circuit "D" connected to an output terminal of each thereof after a given time passes. For example, the delay circuit "D" receiving the signal SNOR from among the delay circuits "D" may output the received signal SNOR to the multiplexer MUX and the delay circuit "D" connected to the output terminal of the delay circuit "D" receiving the signal SNOR after a given time passes. For another example, the delay circuit "D", the output terminal of which is not connected to the delay circuit "D", from among the delay circuits "D" may output a received signal to the multiplexer MUX after a given time passes.

The multiplexer MUX may receive a selection signal SEL from the control logic 11. The multiplexer MUX may select one of the signals received from the delay circuits "D" based on the selection signal SEL. The multiplexer MUX may output the selected signal as the signal SNORD to the latch SR3. In an embodiment, the control logic 11 may adjust a length of an adjusted delay time delayed by the adjustable delay circuit DA by using the selection signal SEL.

The latch SR3 may receive the signal SNOR from the XOR gate XOR2. The latch SR3 may receive the signal SNORD from the adjustable delay circuit DA. The latch SR3 may output the pull-up pulse PU_PULSE based on the received signals SNOR and SNORD.

In the embodiment that is illustrated in FIG. 7, the latch SR3 may use the signal SNOR as a set signal and may use the signal SNORD as a reset signal. The latch SR3 may output the pull-up pulse PU_PULSE to the pull-up circuit 112 by latching the signals SNOR and SNORD.

In an embodiment, the pulse generator 114 may further include a pull-down pulse generating circuit (not illustrated) that generates the pull-down pulse PLABDN. The pull-down pulse generating circuit may receive the precharge signal PRCG from the control logic 11. The pull-down pulse generating circuit may generate the pull-down pulse PLABDN in response to the received precharge signal PRCG. In this case, the pull-down pulse PLABDN may be generated to have a level corresponding to logic "1" as much as the time tWR from a time when the pull-down pulse generating circuit receives the precharge signal PRCG. The pull-down pulse PLABDN may be transmitted to the pull-down circuit 113.

Figure 8:
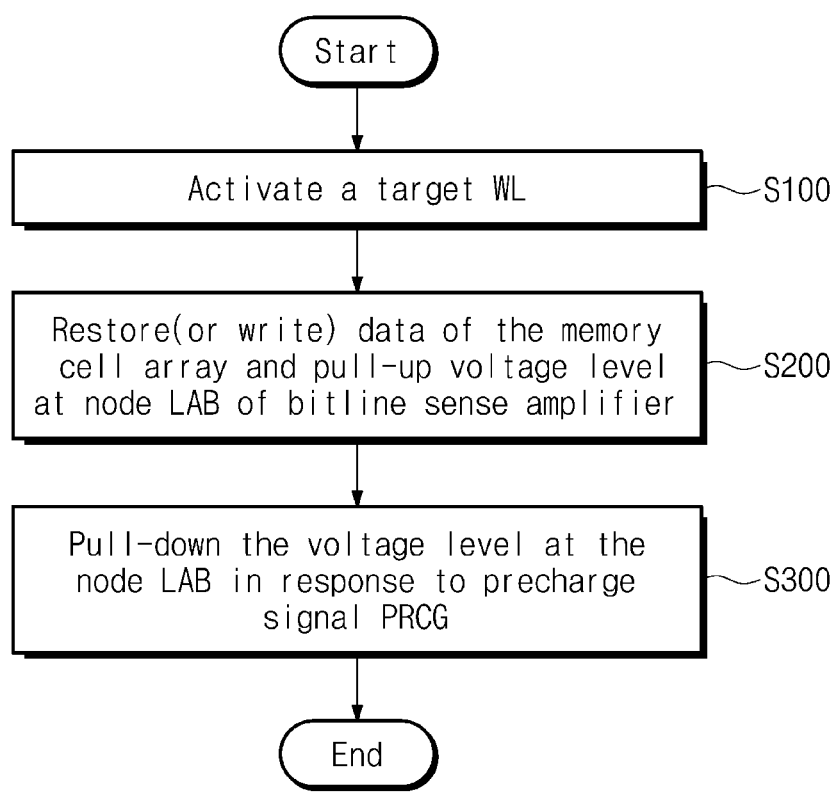
FIG. 8 illustrates a flowchart of an operating method of a memory device according to an embodiment of the inventive concept.

FIG. 8 illustrates a flowchart of an operating method of a memory device according to an embodiment of the inventive concept. Referring to FIGS. 1 to 4 and 8, the memory device 10 may perform operation S100 to operation S300.

In operation S100, the memory device 10 may activate a target wordline. For example, the memory device 10 may select a wordline corresponding to the command/address CA received from the external device and may supply the selected wordline with a voltage capable of turning on transistors connected to the selected wordline.

In operation S200, the memory device 10 may restore data of the memory cell array 12 or may write data in the memory cell array 12, and may pull up a voltage of the node LAB in the bit line sense amplifier 120. For example, the memory device 10 may sense data stored in the memory cells connected to the target wordline activated in operation S100. When data to be stored in a target memory cell of the memory cells connected to the target wordline are not input to the memory device 10, the memory device 10 may restore data to the memory cells connected to the target wordline. If not (i.e., when new data are input to the memory device 10), the memory device 10 may write the new data to the target memory cell. In this case, a data restore operation may be performed on the remaining memory cells of the memory cells connected to the target wordline except for the target memory cell. The memory device 10 may pull up the voltage VLAB of the node LAB in response to the wordline active signal WLACT and the write enable signal WREN.

In operation S300, the memory device 10 may pull down the voltage VLAB of the node LAB to the ground voltage VSS in response to the precharge signal PRCG. For example, the memory device 10 may pull down the voltage VLAB of the node LAB to the ground voltage VSS during a given time in response to the precharge signal PRCG. Afterwards, the memory device 10 may set voltages of the bitline BL and the complementary bitline BLB to the precharge voltage (e.g., ½ VINTA).

Figure 9:
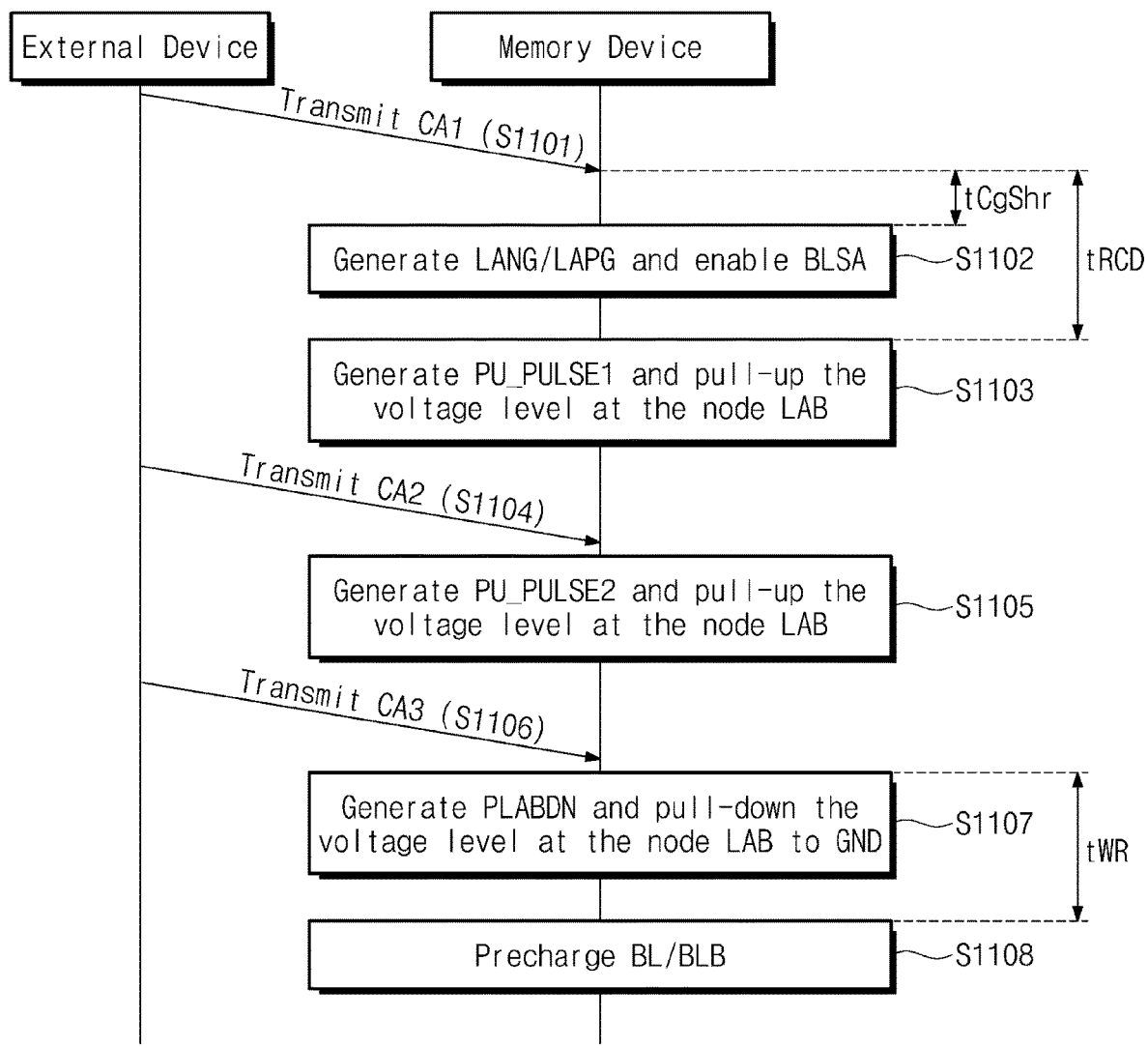
FIG. 9 illustrates a flowchart of an operating method of a system including a memory device according to an embodiment of the inventive concept.

FIG. 9 illustrates a flowchart of an operating method of a system including a memory device according to an embodiment of the inventive concept. Referring to FIGS. 1 to 4 and 7 to 9, the external device of the memory device 10 may perform operation S1101, operation S1104, and operation S1106, and the memory device 10 may perform operation S1102, operation S1103, operation S1105, operation S1107, and operation S1108.

In operation S1101, the external device may transmit a first command/address CA1 to the memory device 10. For example, the first command/address CA1 may include the row address ADDR_R corresponding to a wordline target for activation (i.e., a target wordline) and an active command for activating the target wordline.

In operation S1102, the memory device 10 may generate the develop signals LAPG and LANG and may activate the bitline sense amplifier 120. For example, the memory device 10 may activate the target wordline in response to the first command/address CA1 thus received. The memory device 10 (i.e., the bitline sense amplifier 120 of the memory device 10) may develop the voltage VBL of the bitline BL and the voltage VBLB of the complementary bitline BLB, based on the develop signals LAPG and LANG and the bitline sense amplifier enable signal BLSA_EN.

In the embodiment that is illustrated in FIG. 9, the memory device 10 may perform operation S1102 after the time period tCgShr passes from a time when the first command/address CA1 is received. For example, the memory device 10 may generate the wordline active signal WLACT in response to the first command/address CA1. After the time period tCgShr passes, the memory device 10 may generate the develop signals LANG and LAPG and the bitline sense amplifier enable signal BLSA_EN.

In operation S1103, the memory device 10 may generate a first pull-up pulse PU_PULSE1 and may pull up a voltage level of the node LAB. In the embodiment that is illustrated in FIG. 9, the memory device 10 may perform operation S1103 after the time tRCD passes from a time when the first command/address CA1 is received. For example, after the time tRCD passes from a time when the wordline active signal WLACT is generated, the memory device 10 may generate the first pull-up pulse PU_PULSE1. In response to the first pull-up pulse PU_PULSE1, the bitline sense amplifier driver circuit 110 of the memory device 10 may pull up the voltage VLAB of the node LAB from the ground voltage VSS as much as the delta voltage dVLAB. In an embodiment, the first pull-up pulse PU_PULSE1 may correspond to the pull-up pulse PU_PULSE having the high level during the time period tA, in the third phase Phase3 of FIG. 7.

In operation S1104, the external device may transmit a second command/address CA2 to the memory device 10. For example, the second command/address CA2 may include a write command and the column address ADDR_C indicating a target memory cell targeted for the write operation.

In operation S1105, the memory device 10 may generate a second pull-up pulse PU_PULSE2 and may pull up a voltage level of the node LAB. For example, the memory device 10 may write data in the target memory cell in response to the second command/address CA2. Next, the memory device 10 may generate the second pull-up pulse PU_PULSE2. In response to the second pull-up pulse PU_PULSE2, the bitline sense amplifier driver circuit 110 may pull up the voltage VLAB of the node LAB from the ground voltage VSS as much as the delta voltage dVLAB. In an embodiment, the second pull-up pulse PU_PULSE2 may correspond to the pull-up pulse PU_PULSE having the high level during the time period tB, in the third phase Phase3 of FIG. 7.

In operation S1106, the external device may transmit a third command/address CA3 to the memory device 10. For example, the third command/address CA3 may include a precharge command for requesting the memory device 10 to perform the precharge operation on the bitline BL and the complementary bitline BLB.

In operation S1107, the memory device 10 may generate the pull-down pulse PLABDN and may pull down a voltage level of the node LAB to the ground voltage GND. For example, the memory device 10 may generate the precharge signal PRCG in response to the third command/address CA3 thus received. The memory device 10 may generate the pull-down pulse PLABDN based on the precharge signal PRCG. In response to the pull-down pulse PLABDN, the bitline sense amplifier driver circuit 110 may pull down the voltage VLAB of the node LAB to the ground voltage VSS.

In operation S1108, the memory device 10 may set the bitline BL and the complementary bitline BLB to the precharge voltage. In the embodiment that is illustrated in FIG. 9, the memory device 10 may perform operation S1108 after the time tWR passes from a time when the precharge signal PRCG is generated.

According to an embodiment of the inventive concept, a low level of a voltage to be developed by a bitline sense amplifier may be adjusted based on a command received from an external device so as to be greater than a ground voltage or equal to the ground voltage. As such, the amount of leakage current of a memory cell array due to an operation of the bitline sense amplifier may decrease. Also, data stored in the memory cell array may be prevented from being lost.

While the inventive concept has been described with reference to exemplary embodiments thereof, it will be apparent to those of ordinary skill in the art that various changes and modifications may be made thereto without departing from the spirit and scope of the invention as set forth in the following claims.

What is claimed is:
1. A memory device comprising:
a bitline sense amplifier connected to a bitline and a complementary bitline, the bitline and the complementary bitline connected to a memory cell, and the bitline sense amplifier configured to, in response to a command received from a host, sense and amplify a difference between a voltage of the bitline and a voltage of the complementary bitline such that a first level of a bitline low-level voltage of the bitline sense amplifier is applied to one of the bitline and the complementary bitline; and
a sense amplifier driver circuit configured to, in response to the command, adjust the first level of the bitline low-level voltage to a second level higher than the first level such that the second level of the bitline low-level voltage is applied to the one of the bitline and the complementary bitline,
wherein the command includes an active command, a write command, a read command, or a precharge command,
wherein the sense amplifier driver circuit includes pull-up circuit and pulse generator, the pulse generator configured to generate a first pull-up pulse and a second pull-up pulse, and
wherein the pull-up circuit includes:
a delta voltage generator configured to generate delta voltage;
a first pull-up transistor including first end to which a first internal voltage is applied, a gate to which the second pull-up pulse from the pulse generator is applied, and a second end;
a second pull-up transistor including a first end connected to the second end of the first pull-up transistor, a gate to which a pull-up gate voltage is applied, and a second end to which the bitline low-level voltage is applied;
a third pull-up transistor including a first end to which the bitline low-level voltage is applied and the second end of the second pull-up transistor is connected, a gate to which the second pull-up pulse is applied, and a second end connected to the delta voltage generator applying the delta voltage; and
a first inverter configured to apply the pull-up gate voltage to the gate of the second pull-up transistor based on the first pull-up pulse.

2. The memory device of claim 1, wherein the memory cell includes a transistor of a floating body structure.

3. The memory device of claim 1, wherein the pull-up circuit further includes:
a second inverter including an output terminal connected to an input terminal of the first inverter and an input terminal to which the first pull-up pulse is applied, wherein the sense amplifier driver circuit further includes a regulator circuit, and
wherein the regulator circuit includes:
a first transistor including a first end to which the first internal voltage is applied; and
an amplifier including a first input terminal to which a reference voltage is applied, a second input terminal connected to a second end of the first transistor, and an output terminal connected to a gate of the first transistor.

4. The memory device of claim 1, wherein the delta voltage generator includes a fourth pull-up transistor including a first end connected to the second end of the third pull-up transistor, a gate connected to the second end of the third pull-up transistor, and a second end connected to a ground voltage.

5. The memory device of claim 1, wherein the sense amplifier driver circuit further includes:
a pull-down circuit configured to adjust the second level of the bitline low-level voltage to the first level in response to a pull-down pulse from the pulse generator.

6. The memory device of claim 1, wherein the sense amplifier driver circuit includes a pulse generator configured to generate a first pull-up pulse and a second pull-up pulse, and
wherein the pulse generator includes:
a first latch configured to output a sense amplifier enable signal and a first develop signal corresponding to an inverted version of the sense amplifier enable signal to the bitline sense amplifier, based on an active signal for activating a wordline connected to the memory cell and a precharge signal for precharging the bitline, the active signal and the precharge signal being included in signals generated based on the active command;
a second latch configured to output the second pull-up pulse based on the active signal and the precharge signal;
a first XOR gate configured to receive the sense amplifier enable signal and the second pull-up pulse and output a second develop signal to the bitline sense amplifier;
a second XOR gate configured to output an intermediate signal based on the active signal and a falling edge of a write enable signal of the signals generated based on the active command; and
a third latch configured to output the first pull-up pulse based on the intermediate signal.

7. The memory device of claim 6, wherein the pulse generator further includes a first delay circuit, a second delay circuit, and a third delay circuit,
wherein the first delay circuit is configured to receive the active signal and output the active signal to the first latch and the third delay circuit after a first delay time,
wherein the second delay circuit is configured to receive the precharge signal and output the precharge signal to the first latch after a second delay time, and
wherein the third delay circuit is configured to receive the active signal from the first delay circuit and output the active signal to the second XOR gate after a third delay time.

8. The memory device of claim 6, wherein the pulse generator further includes an adjustable delay circuit including one or more delay circuits and a multiplexer,
wherein the multiplexer is configured to receive a signal output from each of the one or more delay circuits,
wherein the one or more delay circuits are configured to output a delayed intermediate signal to the third latch based on a selection signal, and wherein the third latch outputs the first pull-up pulse further based on the delayed intermediate signal.

9. A memory device comprising:
a bitline sense amplifier connected to a bitline and a complementary bitline, the bitline and the complementary bitline connected to a memory cell, the bitline sense amplifier configured to, in response to an active command received from a host, sense and amplify data stored in the memory cell such that a bitline low voltage of the bitline sense amplifier is applied to one of the bitline and the complementary bitline;
a column decoder configured to select the bitline and the complementary bitline in response to a write column select signal generated based on a write command received from the host; and
a sense amplifier driver circuit configured to:
generate one or more pulses based on the active command, and
adjust a level of the bitline low voltage in response to the one or more pulses,
wherein the sense amplifier driver circuit is configured to, in response to a read command received from the host, adjust the level of the bitline low voltage to a level higher than a ground voltage as much as a delta voltage, and
wherein the sense amplifier driver circuit is configured to, in response to the write column select signal, adjust the level of the bitline low voltage to the ground voltage.

10. The memory device of claim 9, wherein the memory cell includes a transistor of a floating body structure.

11. The memory device of claim 9, wherein the sense amplifier driver circuit is configured to generate a first pull-up pulse of the one or more pulses, the first pull-up pulse:
having a high level during a first adjustment time after a first delay time passes from a time when an active signal is generated based on the active command, and
having the high level during a second adjustment time after a second delay time passes from a time when a write signal is generated based on the write command.

12. The memory device of claim 11, wherein the level of the bitline low voltage depends on a length of the first adjustment time and a length of the second adjustment time.

13. The memory device of claim 9, wherein the sense amplifier driver circuit is configured to generate a pull-down pulse having a high level during a first delay time after a precharge signal is generated based on a precharge command received from the host.

14. The memory device of claim 9, wherein the sense amplifier driver circuit includes a first transistor, and
wherein the delta voltage is a value corresponding to a threshold voltage of the first transistor.

15. An operating method of a memory device which includes a bitline sense amplifier connected to a bitline and a complementary bitline, the bitline and the complementary bitline connected to a plurality of memory cells, the method comprising:
sensing and amplifying data stored in a target memory cell of the plurality of memory cells;
restoring the data stored in the target memory cell and then increasing a voltage level of a first node of the bitline sense amplifier from a ground voltage, or writing a first data in the target memory cell and then increasing the voltage level of the first node of the bitline sense amplifier from the ground voltage; and
decreasing the voltage level of the first node of the bitline sense amplifier to the ground voltage, wherein each of the plurality of memory cells includes a transistor of a floating body structure, wherein a voltage level of the bitline and a voltage level of the complementary bitline are associated with the voltage level of the first node, and wherein the writing of the first data in the target memory cell and the increasing of the voltage level of the first node of the bitline sense amplifier from the ground voltage includes:

receiving a command/address from an external device; and increasing the voltage level of the first node of the bitline sense amplifier based on the command/address as much as a delta voltage.

16. The method of claim 15, wherein the sensing and amplifying of the data stored in the target memory cell includes:
    generating an active signal based on a first command/address; and
    supplying a first internal voltage to each of a first sensing unit and a second sensing unit of the bitline sense amplifier after a first delay time from a time when the active signal is generated.

17. The method of claim 15, further comprising:
    receiving a first command/address from an external device,
    wherein the restoring of the data stored in the target memory cell and the increasing of the voltage level of the first node of the bitline sense amplifier from the ground voltage includes:
    increasing the voltage level of the first node of the bitline sense amplifier as much as a delta voltage, after a first delay time from a time when the first command/address is received.

18. The method of claim 15, wherein the decreasing of the voltage level of the first node of the bitline sense amplifier to the ground voltage includes:
    receiving a command/address from an external device;
    decreasing the voltage level of the first node of the bitline sense amplifier to the ground voltage based on the command/address; and
    setting a bitline and a complementary bitline, the bitline and the complementary bitline connected to the bitline sense amplifier to a precharge voltage level after a first delay time from a time when the command/address is received.

* * * * *